US006297137B1

(12) United States Patent
Jung

(10) Patent No.: US 6,297,137 B1
(45) Date of Patent: Oct. 2, 2001

(54) METHOD FOR FORMING GATE ELECTRODE IN SEMICONDUCTOR DEVICE CAPABLE OF PREVENTING DISTORTION OF OXIDATION PROFILE THEREOF

(75) Inventor: Sung-Hee Jung, Ichon (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/591,402

(22) Filed: Jun. 12, 2000

(30) Foreign Application Priority Data

Jun. 24, 1999 (KR) .................................................. 99-24073

(51) Int. Cl.[7] ................. H01L 21/3205; H01L 21/4763; H01L 21/44
(52) U.S. Cl. ............................ 438/592; 438/592; 438/682
(58) Field of Search .................................... 438/158, 479, 438/180, 682, 255, 585, 592

(56) References Cited

U.S. PATENT DOCUMENTS

| 5,600,154 | * | 2/1997 | Shimizu et al. ....................... 257/66 |
| 5,710,438 | | 1/1998 | Oda et al. . |
| 5,773,344 | | 6/1998 | Matsuoka et al. . |
| 5,933,741 | | 8/1999 | Tseng . |
| 6,017,781 | * | 1/2000 | Shimizu et al. ..................... 438/158 |
| 6,150,266 | * | 11/2000 | Lin et al. ............................. 438/682 |
| 6,187,629 | * | 2/2001 | Gau et al. ............................ 438/255 |
| 6,187,630 | * | 2/2001 | Chen et al. .......................... 438/255 |
| 6,188,085 | * | 2/2001 | Shimizu et al. ....................... 257/66 |
| 6,200,839 | * | 3/2001 | Batra et al. .......................... 438/180 |

* cited by examiner

Primary Examiner—John F. Niebling
Assistant Examiner—Walter L. Lindsay, Jr.
(74) Attorney, Agent, or Firm—Blakely Sokoloff Taylor & Zafman

(57) ABSTRACT

The present invention relates to a method for forming a semiconductor device; and, more particularly, to a method for forming a gate electrode capable of preventing distortion of oxidation profile thereof. A method for forming a gate electrode in accordance with the present invention comprises the steps of: forming a conducting layer for a gate electrode on a predetermined semiconductor substrate; forming a silicon layer on sidewalls of the conducting layer through a silicon ion implantation; forming a gate pattern by patterning the conducting layer using the etching barrier pattern for the gate electrode, thereby forming the gate electrode having the silicon layer on sidewalls thereof; and applying a thermal treatment to the semiconductor substrate.

5 Claims, 2 Drawing Sheets

walls of the conducting layer through a silicon ion implantation; forming a gate pattern by patterning the conducting layer using the etching barrier pattern for the gate electrode, thereby forming the gate electrode having the silicon layer on sidewalls thereof; and applying a thermal treatment to the semiconductor substrate.

METHOD FOR FORMING GATE ELECTRODE IN SEMICONDUCTOR DEVICE CAPABLE OF PREVENTING DISTORTION OF OXIDATION PROFILE THEREOF

FIELD OF THE INVENTION

The present invention relates to a method for forming a semiconductor device; and, more particularly, to a method for forming a gate electrode in a DRAM (Dynamic Random access memory) device.

DESCRIPTION OF THE PRIOR ARTS

Generally, semiconductor devices are divided into read/write memory devices and read only memory devices. Especially, in the read/write memory devices, a unit cell in the DRAM device has only one transistor and one capacitor so that the DRAM can achieves a highly integrated memory device. Accordingly, with the increase of the integration, 64 Mb DRAMs have been mass-produced and the researches to increase the productivity and yield thereof are steadily in progress.

Furthermore, 256 Mb DRAMs have been already developed and investigation goes deep into the study of 1 Gb DRAMs. In such a highly integrated memory device, for example, 1 Gb memory device, the line width may be about 0.08 $\mu m^2$. Accordingly, the line width required in a gate electrode of a transistor is getting narrower. As a result, since gate electrodes, which are made of the conventional polysilicon or tungsten silicide layer, may not satisfy a low resistance with such a narrow line width, a low resistant material, such as $TiSi_2$, $CoSi_2$ or W, have been used as a gate electrode.

However, it is very difficult to obtain high speed corresponding to such a high integration in mass production, by employing the silicide and metal layer as a gate electrode. That is, when gate conducting layers, such as W, $TiSi_2$, and $CoSi_2$ layers are deposited on a gate insulating layer and these layer are etched through an etching mask for the gate electrode, the gate insulating layer deteriorates. To prevent this problem and protect a substrate in LDD (Lightly Doped Drain) ion-implantation, a re-oxidation process is carried out. However, this re-oxidation process causes the tungsten layer to be oxidized and deforms a word line of the patterned gate electrode.

Particularly, since the tungsten layer is characteristic of higher oxidation, the thermal stability of the tungsten gate electrode may not be guaranteed. Furthermore, the tungsten layer has a demerit in that the oxidation profile of the tungsten layer is considerably expanded so that it is very difficult to achieve a gap filling in forming an interlayer insulating layer.

SUMMARY OF THE INVENTION

It is, therefore, an object of the present invention to provide a method for forming a gate electrode in a memory device, in especially DRAM.

It is another object of the present invention to provide a method for preventing a gate electrode from being oxidized in a thermal treatment.

In accordance with an aspect of the present invention, there is provided a method for forming a gate electrode in a semiconductor device comprising the steps of: forming a conducting layer for a gate electrode on a predetermined semiconductor substrate; forming a silicon layer on sidewalls of the conducting layer through a silicon ion implantation; forming a gate pattern by patterning the conducting layer using the etching barrier pattern for the gate electrode, thereby forming the gate electrode having the silicon layer on sidewalls thereof; and applying a thermal treatment to the semiconductor substrate.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Hereinafter, the present invention will be described in detail referring to the accompanying drawings.

Figure 1A:
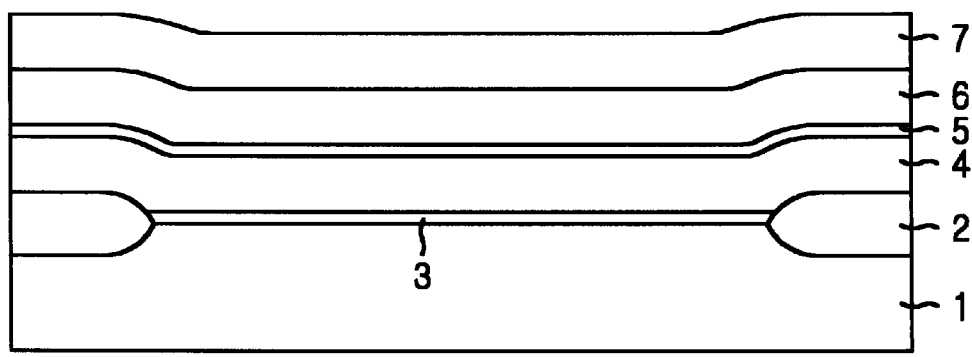
FIGS. 1A to 1D are cross-sectional views illustrating an embodiment of the present invention.

Referring to FIG. 1A, a gate insulating layer 3, a doped polysilicon layer 4, a tungsten nitride ($WN_x$) layer 5, a tungsten layer 6 and a mask insulating layer 7 are, in this order, deposited on a semiconductor substrate 1 in which a filed oxide layer 2 is formed. The tungsten layer 6 may be formed by a sputtering method below 500° C. and below 20 mTorr or by a chemical vapor deposition method (CVD) using $H_2$ and $WF_6$ gases below 500° C. and below 10 mTorr.

Figure 1B:
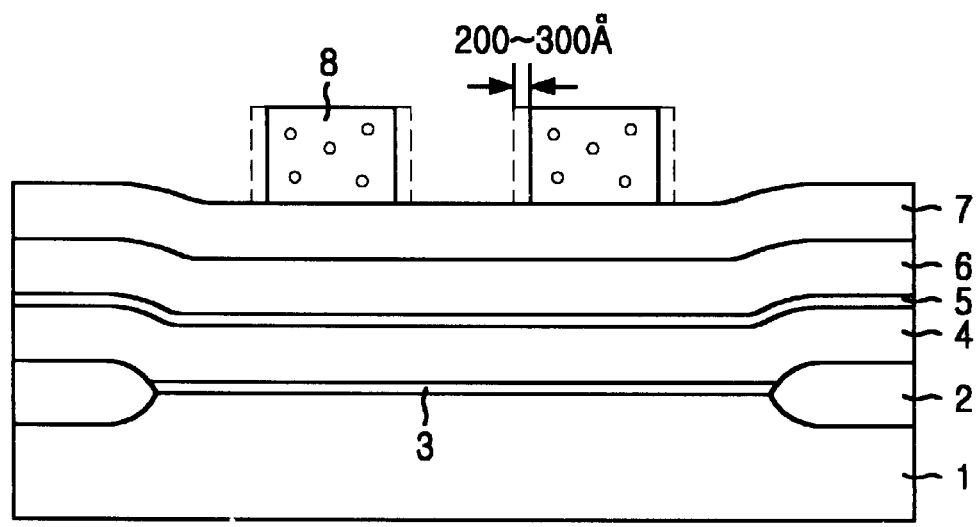

Next, referring to FIG. 1B, a mask pattern 8 is formed on the mask insulating layer 7, being positioned over a gate electrode to be formed. However, the width of the mask pattern 8 is narrower than that of the gate electrode. In a preferred embodiment, the width of the mask pattern 8 is 200–300 Å narrower than that of the gate electrode.

Figure 1C:
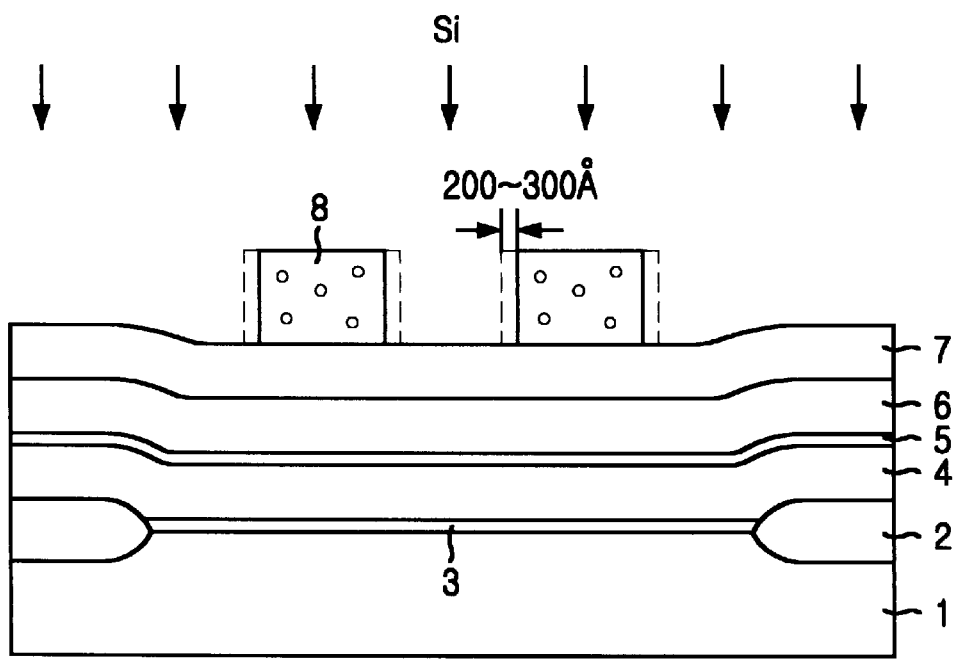

Subsequently, as shown in FIG. 1C, a silicon ion-implantation process is applied to the resulting structure so that the ion implantation layer is formed on the sidewalls of the tungsten layer 6 and the tungsten nitride ($WN_x$) layer 5. Accordingly, the ion acceleration energy and dose should be controlled by considering the thickness of the stacked layer having the mask pattern 8, the insulating layer 7, the tungsten layer 6 and the tungsten nitride ($WN_x$) layer 5. Preferably, $SiH_4$ or $SiF_4$ of 1E15 ions/cm² may be implanted into the resulting structure at an acceleration energy of 10–50 KeV.

Figure 1D:
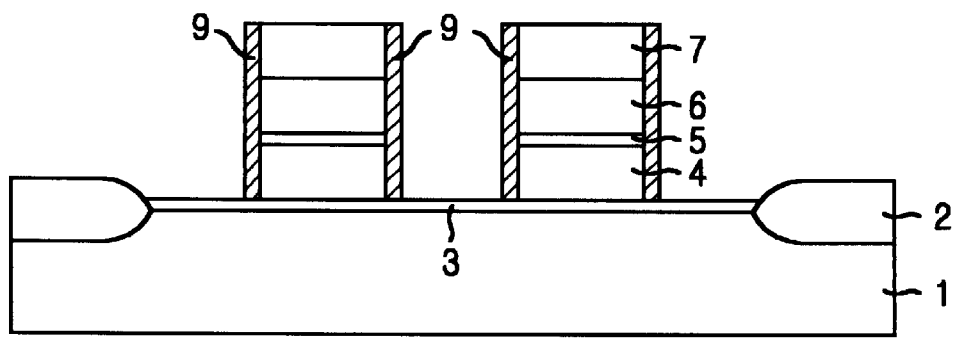

Finally, referring to FIG. 1D, the mask pattern 8 is removed and an etching barrier mask (not shown and designed in the same scale as the gate pattern) for the gate electrode is formed on the mask insulating layer 7. The mask insulating layer 7, the tungsten layer 6, the tungsten nitride layer 5 and the doped polysilicon layer 4 are, in this order, etched using the etching barrier mask. Thereafter, the re-oxidation process is carried out to protect the semiconductor substrate 1 at the LDD (Lightly Doped Drain) ion implantation and to compensate the gate insulation layer 3 which is damaged from the previous ion implantation. At this time, the silicon ions implanted at the edges of the patterned layers are out-diffused and are reacted with oxygen ions at the oxygen atmosphere, thereby forming a sidewall protecting oxide layer 9 at the edges of the patterned layers. The sidewall protecting oxide layer 9 plays an important part of preventing the sidewalls of the tungsten layer 6 and the doped polysilicon layer 4, guaranteeing the formation of a stable tungsten gate electrode.

Although the present invention is explained about a stacked gate structure having the conductive polysilicon layer and the tungsten layer, it is possible to apply the present invention to other single-layer gate structures and other stacked gate structures. For example, in case where metal or metal silicide layers, such as $TiSi_2$ or $CoSi_2$ layer, are used as a gate electrode, the present invention may be applicable to these gate electrodes.

The deposition of $WSi_x$ layer may be carried out below 600° C. and below 1 Torr using $SiH_4$ and $WF_6$ gases. Also, in case of the composite target using $TiSi_2$ and $CoSi_2$, the formation of gate electrode may be carried out by the sputtering method below 500° C. and below 1 Torr.

On the other hand, in the case of a silicon-rich tungsten silicide ($WSi_x$, x=2.6) layer which has been used in typical tungsten silicide deposition process, the amount of the silicon may be set to about x=2 in order to prevent the increase of resistance and, as set forth above, the silicon ion implantation layer maybe formed on the sidewalls of the tungsten silicide layer.

As apparent form the above, the present invention prevents distortion of the gate electrode, which is caused by the reoxidation of the metal and silicide layers and improves the gap filling of an interlayer insulating layer. Further, such an additional ion implantation makes grain size small so that the profile of the sidewall of the gate electrode is improved, thereby increasing the productivity and yield in mass-production of the memory devices.

Although the preferred embodiments of the invention have been disclosed for illustrative purposes, those skilled in the art will appreciate that various modifications, additions and substitutions are possible, without departing from the scope and spirit of the invention as disclosed in the accompanying claim.

What is claimed is:

1. A method for forming a gate electrode in a semiconductor device, comprising the steps of:

forming a conducting layer for a gate electrode on a predetermined semiconductor substrate;

forming a silicon layer on sidewalls of the conducting layer through a silicon ion implantation;

forming a gate pattern by patterning the conducting layer using the etching barrier pattern for the gate electrode, thereby forming the gate electrode having the silicon layer on sidewalls thereof; and applying a thermal treatment to the semiconductor substrate.

2. The method in accordance with claim 1, wherein the conducting layer is one of tungsten, tungsten silicide, $TiSi_2$, and $CoSi_2$ layers.

3. The method in accordance with claim 2, further comprising the step of controlling a dose of silicon ions in the silicon ion implantation, by considering an amount of silicon in the tungsten silicide layer.

4. The method in accordance with claim 1, wherein the silicon layer on sidewalls of the conducting layer is formed using an ion implantation process and an ion implantation mask smaller than an etching barrier pattern for the gate electrode.

5. The method in accordance with claim 4, wherein the ion implantation process is carried out by $SiH_4$ or $SiF_4$ of 1E15 ions/$cm^2$ at an acceleration energy of 10–50 KeV.

* * * * *